(12) United States Patent
Lim

(10) Patent No.: US 8,531,874 B2
(45) Date of Patent: Sep. 10, 2013

(54) NONVOLATILE MEMORY DEVICE AND METHOD OF OPERATING THE SAME

(75) Inventor: Sang Oh Lim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 166 days.

(21) Appl. No.: 13/177,642

(22) Filed: Jul. 7, 2011

(65) Prior Publication Data

US 2012/0008424 A1  Jan. 12, 2012

(30) Foreign Application Priority Data

Jul. 9, 2010  (KR) .................. 10-2010-0066492

(51) Int. Cl.
*G11C 11/00* (2006.01)

(52) U.S. Cl.
USPC ........................................... 365/158

(58) Field of Classification Search
USPC .................................. 365/185.03
See application file for complete search history.

(56) References Cited

U.S. PATENT DOCUMENTS

| 2008/0144370 | A1* | 6/2008 | Park et al. ............... | 365/185.03 |
| 2010/0306579 | A1* | 12/2010 | Baek et al. ............... | 714/6 |
| 2010/0309725 | A1* | 12/2010 | Huh ....................... | 365/185.12 |
| 2011/0299341 | A1* | 12/2011 | Lim et al. ................ | 365/185.24 |
| 2012/0314506 | A1* | 12/2012 | Baek et al. ............... | 365/185.25 |

FOREIGN PATENT DOCUMENTS

KR  1020090000375 A  1/2009

* cited by examiner

*Primary Examiner* — Hoai V Ho
*Assistant Examiner* — Min Huang
(74) *Attorney, Agent, or Firm* — William Park & Associates Patent Ltd.

(57) ABSTRACT

A nonvolatile memory device includes a plurality of latches for storing data, a set/reset circuit for transferring data, stored in a selected latch of the latches, to a common node, a transmission circuit for transferring the data of the common node to a first sense node, a bit line transmission circuit for transferring the data of the first sense node to a bit line, a sense circuit for transferring the data of the first sense node to a second sense node, and a discharge circuit for changing a voltage level of the common node based on the data of the second sense node.

11 Claims, 6 Drawing Sheets

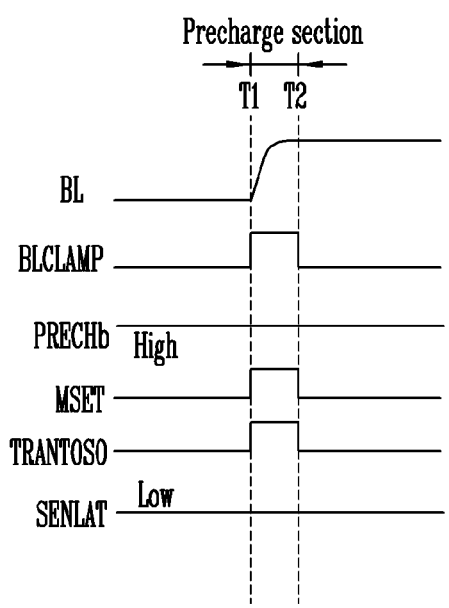
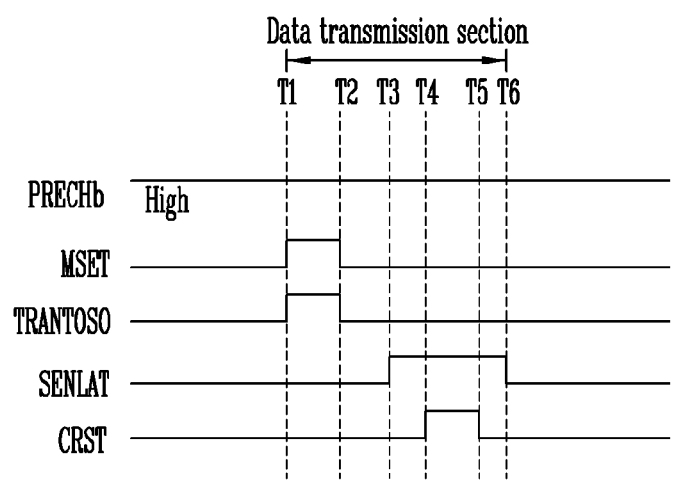

NONVOLATILE MEMORY DEVICE AND METHOD OF OPERATING THE SAME

CROSS-REFERENCE TO RELATED APPLICATION

Priority to Korean patent application number 10-2010-0066492 filed on Jul. 9, 2010, the entire disclosure of which is incorporated by reference herein, is claimed.

BACKGROUND

Exemplary embodiments relate to a nonvolatile memory device and a method of operating the same, and, more particularly, to a page buffer.

FIG. 1 is a circuit diagram showing a known page buffer.

The page buffer includes a bit line selector 11, a bit line transmission circuit 12, a precharge circuit 13, a data transmission circuit 14, a latch circuit 15, a set/reset circuit 16, a data I/O circuit 17, and a discharge circuit 18.

The bit line selector 11 is used to select a bit line BL coupled to a memory cell array (not shown).

The bit line transmission circuit 12 electrically couples a sense node SO and the bit line BL, selected by the bit line selector 11, in response to a bit line transmission signal BLCLAMP. The bit line transmission circuit 12 comprises an NMOS transistor T1 operated in response to the bit line transmission signal BLCLAMP.

The precharge circuit 13 transfers power supply voltage Vcc to the sense node SO in response to a precharge signal PRECHb. The precharge circuit 13 is coupled between a terminal for the power supply voltage Vcc and the sense node SO, and comprises a PMOS transistor T2 operated in response a precharge signal PRECHb.

The data transmission circuit 14 transfers a certain voltage based on data stored in the latch circuit 15 to the sense node SO, or transfers data, stored in the latch circuit 15, to different latches. Each of the latches is formed of a pair of inverters. The latch circuit 15 includes a plurality of latches for storing data. Accordingly, in order to transfer the data of the plurality of latches to the sense node SO, the data transmission circuit 14 includes a plurality of switch devices T3 to T10. The switch devices T3 to T10 comprise respective NMOS transistors operated in response to respective switch signals S3 to S10.

The set/reset circuit 16 sets or resets the latches of the latch circuit 15, and includes a plurality of NMOS transistors T11 to T18 coupled between a common source CON and the respective latches of the latch circuit 15. The NMOS transistors T12, T14, T16, and T18 for setting the latches are operated in response to respective set signals CSET, MSET, TSET, and FSET. Voltage levels of respective nodes QC, QM, QT, and QF of the latches are determined in response to the respective set signals CSET, MSET, TSET, and FSET. The NMOS transistors T11, T13, T15, and T17 for resetting the latches are operated in response to respective reset signals CRST, MRST, TRST, and FRST. Voltage levels of respective nodes QC_N, QM_N, QT_N, and QF_N of the nodes are determined in response to respective reset signals CRST, MRST, TRST, and FRST.

The data I/O circuit 17 is coupled to any one of the latches of the latch circuit 15 and is configured to input data to the relevant latch or externally output data of the relevant latch. If the data I/O circuit 17 is coupled to the latch including the node QC and the node QC_N, the data I/O circuit 17 includes an NMOS transistor T20 for coupling the node QC and a data line DL and an NMOS transistor T21 for coupling the node QC_N and a data line DL/, in response to an I/O signal CS.

The discharge circuit 18 comprises an NMOS transistor T19 coupled between the common node CON and a ground terminal Vss, and configured to discharge the common node CON in response to a voltage level of the sense node SO.

Meanwhile, with an increase in the number of transistors of a page buffer, the number of signals for operating the transistors also increases, and thus a method of operating the page buffer may become complicated. Furthermore, the size of a nonvolatile memory device may increase with an increase in the number of transistors.

BRIEF SUMMARY

According to exemplary embodiments, an operation can be simplified and the size of a chip can be reduced by reducing the number of transistors of a page buffer.

A nonvolatile memory device according to an aspect of the present disclosure includes a plurality of latches for storing data; a set/reset circuit for transferring data, stored in a selected latch of the latches, to a common node; a transmission circuit for transferring the data of the common node to a first sense node; a bit line transmission circuit for transferring the data of the first sense node to a bit line; a sense circuit for transferring the data of the first sense node to a second sense node; and a discharge circuit for changing a voltage level of the common node based on the data of the second sense node.

The sense circuit is implemented using an NMOS transistor for coupling the first sense node and the second sense node in response to a sense signal.

The precharge circuit is implemented using an NMOS transistor for discharging the second sense node by coupling the second sense node and a terminal for supplying a variable voltage, in response to a precharge signal.

The variable voltage is a power supply voltage or a ground voltage.

The discharge circuit is implemented using an NMOS transistor for discharging the common node based on a voltage level of the second sense node.

The transmission circuit is implemented using an NMOS transistor for transferring voltage, transferred to the common node, to the first sense node in response to a transmission signal.

The nonvolatile memory device further includes a data I/O circuit coupled to any one of the latches and configured to input or output data.

The set/reset circuit includes a reset switch and a set switch which are coupled to each of the latches.

A nonvolatile memory device according to another aspect of the present disclosure includes a plurality of latches for storing data; a set/reset circuit for transferring data, stored in a selected latch of the latches, to a common node; a transmission circuit for transferring the data of the common node to a sense node; a bit line transmission circuit for transferring the data of the sense node to a bit line; and a discharge circuit for changing a voltage level of the common node based on the data of the sense node.

The precharge circuit is implemented using a PMOS transistor for precharging the sense node by coupling a power supply terminal and the sense node in response to a precharge signal.

The discharge circuit includes a sense switch and a discharge switch coupled in series between the common node and a ground terminal.

The sense switch is implemented using an NMOS transistor for coupling the common node and the discharge switch in response to a sense signal.

The discharge switch is implemented using an NMOS transistor for coupling the sense switch and the ground terminal based on a voltage level of the sense node.

The transmission circuit is implemented using an NMOS transistor for transferring voltage, supplied to the common node, to the sense node in response to a transmission signal.

The nonvolatile memory device further includes a data I/O circuit coupled to any one of the latches and configured to input or output data.

The set/reset circuit includes a reset switch and a set switch which are coupled to each of the latches.

A method of operating a nonvolatile memory device according to yet another aspect of the present disclosure includes providing a page buffer, including a sense switch coupled between a first sense node and a second sense node, a transmission switch coupled between the first sense node and a common node, a discharge switch configured to discharge the common node based on a voltage level of the second sense node, and a plurality of latches configured to transmit inputted data to the common node; inputting data to any one of the latches; transferring the data, inputted to the latch, to the common node; transferring the data of the common node to the first sense node by deactivating the sense switch and the discharge switch and activating a transmission signal; and precharging or discharging a selected bit line based on the data of the first sense node.

Inputting the data to any one of the latches includes inputting the data to a latch coupled to a data I/O circuit, from among the latches and transferring the data of the latch, coupled to the data I/O circuit, to another latch.

Transferring the data of the latch, coupled to the data I/O circuit, to another latch includes deactivating the discharge switch and transferring the data of the latch, coupled to the data I/O circuit, to the common node; transferring the data of the common node to the first sense node by activating the transmission switch; transferring the data of the first sense node to the second sense node by deactivating the transmission switch and activating the sense switch; discharging the common node or maintaining the common node in a previous state by operating the discharge switch based on the data of the second sense node; and coupling the common node and a latch to which data will be inputted.

A method of operating a nonvolatile memory device according to further yet another aspect of the present disclosure includes providing a page buffer, comprising a transmission switch coupled between a sense node and a common node, a discharge switch operated based on a voltage level of the sense node, a sense switch coupled between the common node and the discharge switch and operated in response to a sense signal, and a plurality of latches configured to transmit inputted data to the common node; inputting data to any one of the latches; transferring the data, inputted to the latch, to the common node; transferring the data of the common node to the sense node by deactivating the sense switch and activating a transmission signal; and precharging or discharging a selected bit line based on the data of the sense node.

Inputting the data to any one of the latches includes inputting the data to a latch coupled to a data I/O circuit, from among the latches and transferring the data of the latch, coupled to the data I/O circuit, to another latch.

Transferring the data of the latch, coupled to the data I/O circuit, to another latch includes deactivating the sense switch and transferring the data of the latch, coupled to the data I/O circuit, to the common node; transferring the data of the common node to the sense node by activating the transmission switch; discharging the common node or maintaining the common node in a previous state according to the discharge switch by activating the sense switch; and coupling the common node and a latch to which data will be inputted.

BRIEF DESCRIPTION OF THE DRAWINGS

FIGS. 6A and 6B are timing diagrams illustrating a method of operating the page buffer of FIG. 5.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
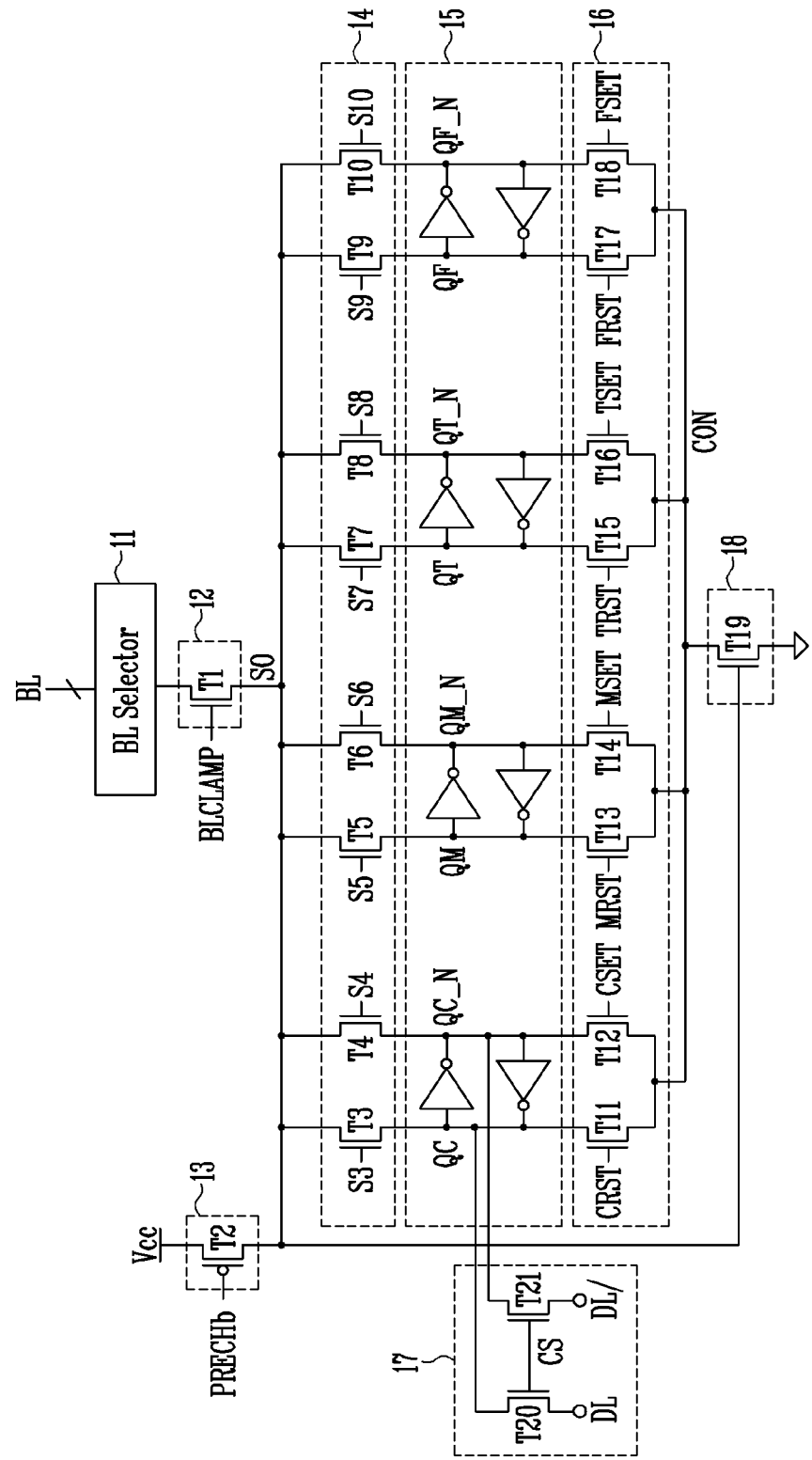
FIG. 1 is a circuit diagram showing a known page buffer.
Figure 2:
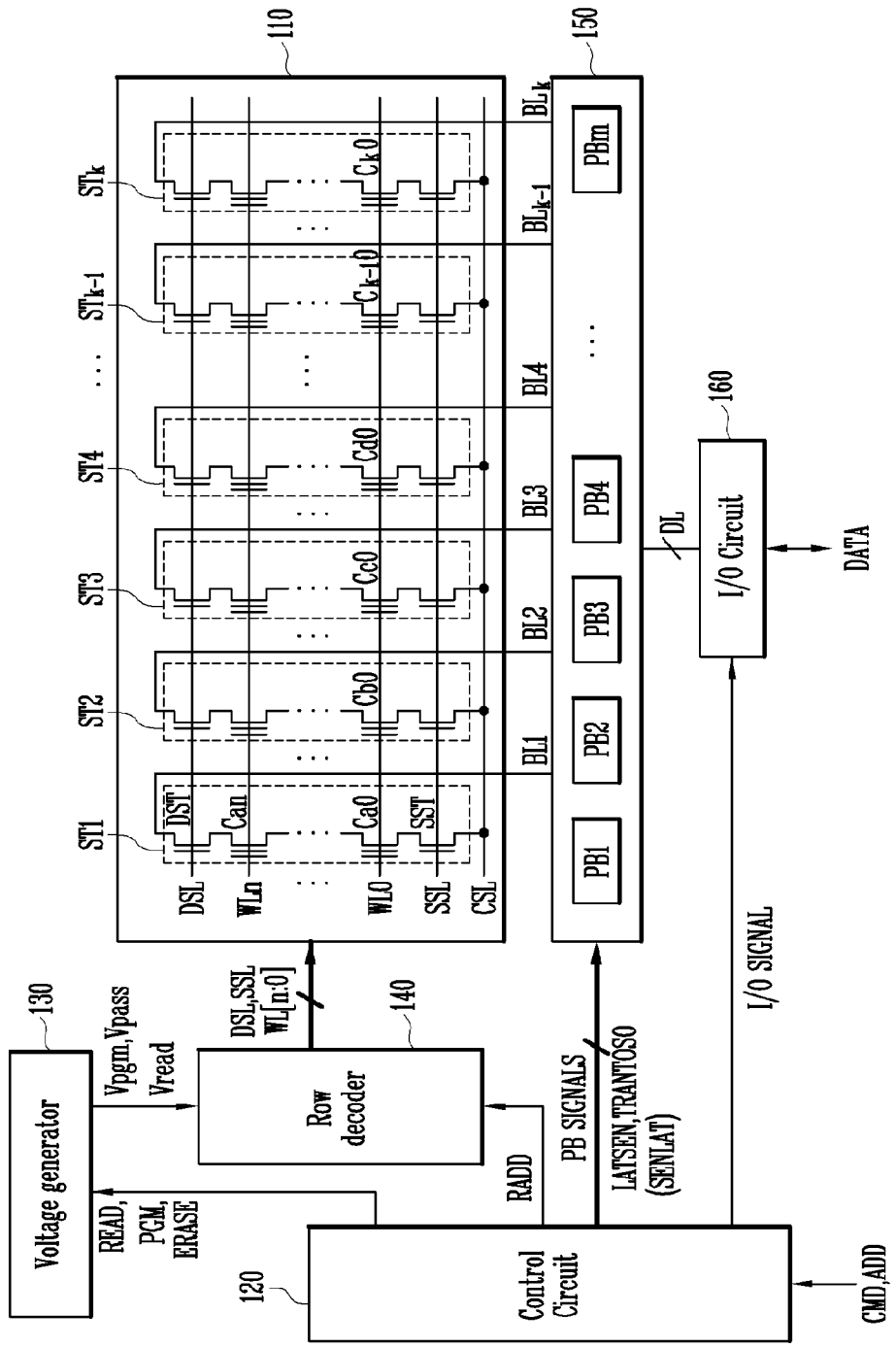
FIG. 2 a block diagram showing a nonvolatile memory device according to this disclosure.

FIG. 2 a block diagram showing a nonvolatile memory device according to this disclosure.

The nonvolatile memory device according to the exemplary embodiment of this disclosure includes a memory cell array 110, an operation circuit group (130, 140, 150, and 160) configured to perform a program operation or a read operation for the memory cells of the memory cell array 110, and a control circuit 120 configured to control the operation circuit group (130, 140, 150, and 160).

In the case of an NAND flash memory device, the operation circuit group may include a voltage generator 130, a row decoder 140, a page buffer group 150, and an I/O circuit 160.

The memory cell array 110 includes a plurality of memory blocks. It is to be noted that FIG. 2 shows only one of the memory blocks. The memory block includes a plurality of strings ST1 to STk. Each (for example, ST1) of the strings includes a source select transistor SST coupled to a common source line CSL, a plurality of memory cells Ca0 to Can, and a drain select transistor DST coupled to a bit line BL1.

The gate of the source select transistor SST is coupled to a source select line SSL. The gates of the memory cells Ca0 to Can are coupled to respective word lines WL0 to WLn. The gate of the drain select transistor DST is coupled to a drain select line DSL. The strings ST1 to STk are coupled to respective bit lines BL1 to BLk and are coupled in common to the common source line CSL.

The control circuit 120 internally outputs a program operation signal PGM, a read operation signal READ, or an erase operation signal ERASE in response to a command signal CMD, and outputs control signals PB SIGNALS, LATSEN (or SENLAT), or TRANTOSO for controlling the page buffers of the page buffer group 150 according to a type of the operation. Furthermore, the control circuit 120 internally outputs a row address signal RADD in response to an address signal ADD.

The power supply circuit (130, 140) supplies operating voltages for a program operation, an erase operation, or a read operation for the memory cells to the drain select line DSL, the word lines WL0 to WLn, and the source select line SSL of a selected memory block in response to the signals READ, PGM, ERASE, and RADD of the control circuit 120. The power supply circuit includes the voltage generator 130 and the row decoder 140.

The voltage generator 130 outputs the operating voltages for programming, reading, or erasing the memory cells to global lines in response to the internal command signals (that is, the operation signals PGM, READ, and ERASE) of the control circuit 120 and outputs operating voltages (for example, Vpgm, Vpass, and Vpass) for programming or reading the memory cells to the global lines in response to the internal command signals when the memory cells are programmed or read.

The row decoder 140 transfers the operating voltages of the voltage generator 130 to the strings ST1 to STk of a selected memory block of the memory cell array 110 in response to the row address signals RADD of the control circuit 120. That is, the operating voltages are supplied to the local lines DSL, WL[n:0], and SSL of the selected memory block.

The page buffer group 150 includes the page buffers PB1 to PBm coupled to the respective bit lines BL1 to BLk. The page buffer group 150 supplies voltages used to store data in the memory cells Ca0 to Ck0 to the respective bit lines BL1 to BLk in response to the control signals PB SIGNALS, LATSEN (or SENLAT), and TRANTOSO of the control circuit 120. More particularly, the page buffer group 150 charges the bit lines BL1 to BLk or latches data corresponding to threshold voltages of the memory cells Ca0 to Ck0 when a program operation, an erase operation, or a read operation for the memory cells Ca0 to Ck0 is performed. That is, the page buffer group 150 controls voltages of the bit lines BL1 to BLk based on data stored in the memory cells Ca0 to Ck0 and detects data stored in the memory cells Ca0 to Ck0.

When the I/O circuit 160 sequentially transfers external data DATA to the page buffers PB1 to PBm of the page buffer group 150 under the control of the control circuit 120 during a program operation, the page buffers PB1 to PBm store the inputted data in their internal latches.

Furthermore, when a read operation is performed, the I/O circuit 160 externally outputs the data DATA received from the page buffers PB1 to PBm of the page buffer group 150.

One (for example, PBm) of the page buffers PB1 to PBm, included in the page buffer group 150 of the nonvolatile memory device, is described below in detail.

Figure 3:
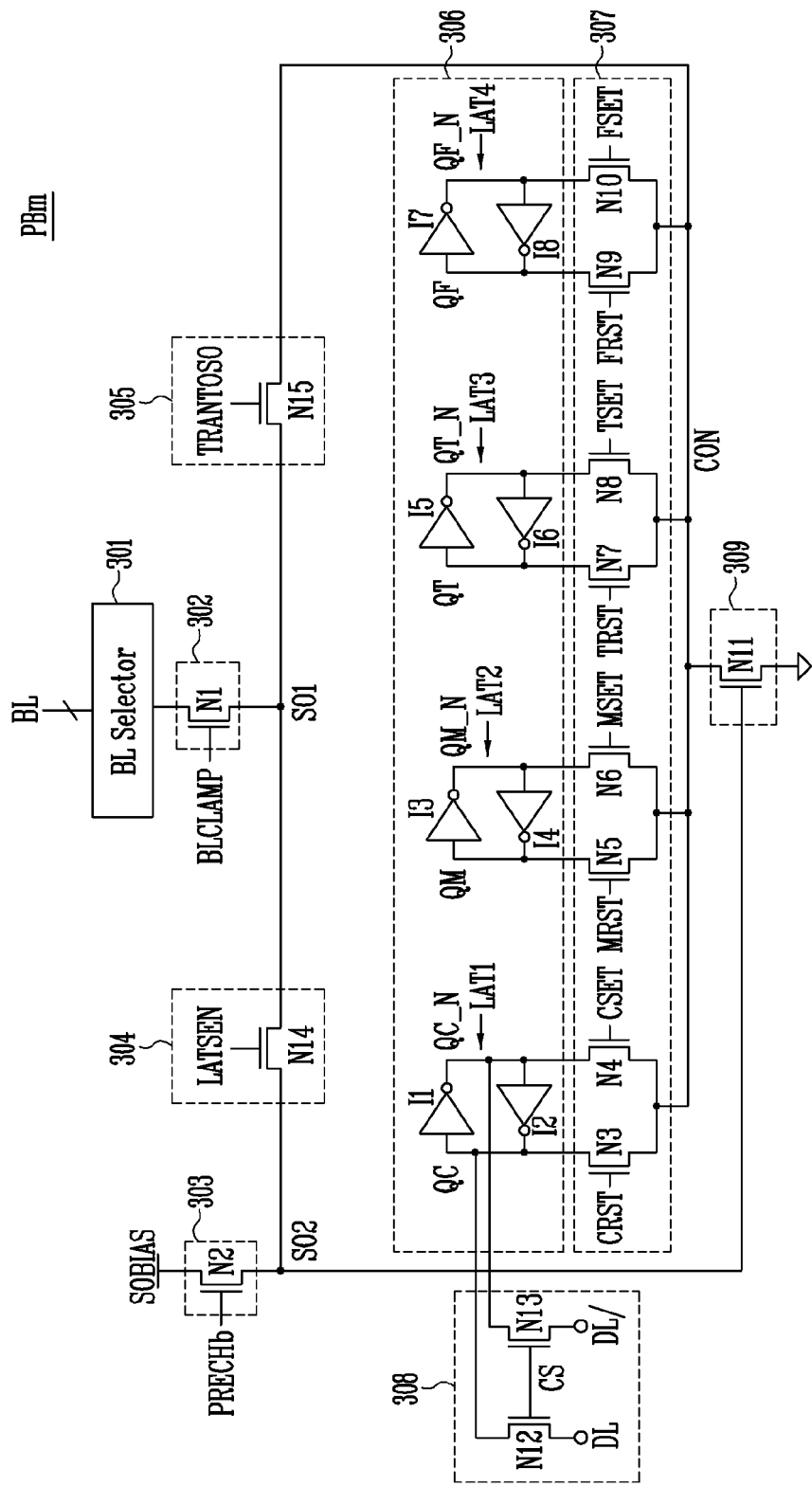
FIG. 3 is a circuit diagram showing a page buffer according to an exemplary embodiment of this disclosure.

FIG. 3 is a circuit diagram showing the page buffer according to an exemplary embodiment of this disclosure.

The page buffer PBm includes a bit line selector 301, a bit line transmission circuit 302, a first discharge circuit 303, a sense circuit 304, a transmission circuit 305, a latch circuit 306, a set/reset circuit 307, a data I/O circuit 308, and a second discharge circuit 309.

The bit line selector 301 selects the bit lines BL coupled to the memory cell array 110.

The bit line transmission circuit 302 couples the bit line BL, selected by the bit line selector 301, to a first sense node SO1 in response to a bit line transmission signal BLCLAMP. Also, the bit line transmission circuit 302 comprises an NMOS transistor N1 coupled between the bit line selector 301 and the first sense node 501.

The first discharge circuit 303 comprises an NMOS transistor N2 coupled between a variable voltage node and a second sense node SO2, and operated in response to a discharge signal DICHSO. Here, according to an example, the variable voltage of the variable voltage node is a power supply voltage or a ground voltage.

The first discharge circuit 303 couples the ground terminal Vss and the second sense node SO2 in response to a discharge signal DICHSO and discharges the second sense node SO2.

The sense circuit 304 comprises an NMOS transistor N14 coupled between the first sense node SO1 and the second sense node SO2, and operated in response to a sense signal LATSEN. The sense circuit 304 disconnects the first sense node SO1 and the second sense node SO2 when the bit line BL is charged. Also, the sense circuit 304 transfers voltage of the first sense node SO1 to the second sense node SO2 when data is transmitted.

The transmission circuit 305 comprises an NMOS transistor N15 coupled between the first sense node SO1 and a common node CON, and operated in response to a transmission signal TRANTOSO.

In the exemplary embodiment of this disclosure, the latch circuit 306 including four latches, i.e., a first to a fourth latches LAT1 to LAT4 is described as an example. The first latch LAT1 includes a first inverter I1 and a second inverter I2. The output terminal of the first inverter I1 and the input terminal of the second inverter I2 are coupled, and the output terminal of the second inverter I2 and the input terminal of the first inverter I1 are coupled. A node coupled to the input terminal of the first inverter I1 is called a first node QC, and a node coupled to the output terminal of the first inverter I1 is called a second node QC_N. In particular, the first latch LAT1 is coupled to the data I/O circuit 308 and is configured to store data received from the data I/O circuit 308 or transfer inputted data to the data I/O circuit 308. Furthermore, the first latch LAT1 transfers data, received from the data I/O circuit 308, to other latches. The data I/O circuit 308 is described later.

The second latch LAT2 includes a third inverter I3 and a fourth inverter I4. The output terminal of the third inverter I3 and the input terminal of the fourth inverter I4 are coupled, and the output terminal of the fourth inverter I4 and the input terminal of the third inverter I3 are coupled. A node coupled to the input terminal of the third inverter I3 is called a third node QM, and a node coupled to the output terminal of the third inverter I3 is called a fourth node QM_N. The third latch LAT3 includes a fifth inverter I5 and a sixth inverter I6. The output terminal of the fifth inverter I5 and the input terminal of the sixth inverter I6 are coupled, and the output terminal of the sixth inverter I6 and the input terminal of the fifth inverter I5 are coupled. A node coupled to the input terminal of the fifth inverter I5 is called a fifth node QT, and a node coupled to the output terminal of the fifth inverter I5 is called a sixth node QT_N. The fourth latch LAT4 includes a seventh inverter I7 and an eighth inverter I8. The output terminal of the seventh inverter I7 and the input terminal of the eighth inverter I8 are coupled, and the output terminal of the eighth inverter I8 and the input terminal of the seventh inverter I7 are coupled. A node coupled to the input terminal of the seventh inverter I7 is called a seventh node QF, and a node coupled to the output terminal of the seventh inverter I7 is called an eighth node QF_N.

The set/reset circuit 307 sets or resets the first to fourth latches LAT1 to LAT4 of the latch circuit 306. Also, the set/reset circuit 307 transfers data. The set/reset circuit 307 includes a plurality of switch devices N3 to N10 coupled between the first to eighth nodes QC to QF_N and the common source CON. Each of the switch devices N3 to N10 comprises an NMOS transistor. Each of the switch devices N3 to N10 is described in detail below.

The first reset switch device N3 is coupled between the first node QC and the common node CON, and operated in response to a first reset signal CRST. The first set switch device N4 is coupled between the second node QC_N and the common node CON, and operated in response to a first set signal CSET. The second reset switch device N5 is coupled between the third node QM and the common node CON, and operated in response to a second reset signal MRST. The second set switch device N6 is coupled between the fourth node QM_N and the common node CON, and operated in response to a second set signal MSET. The third reset switch device N7 is coupled between the fifth node QT and the common node CON, and operated in response to a third reset signal TRST. The third set switch device N8 is coupled between the sixth node QT_N and the common node CON, and operated in response to a third set signal TSET. The fourth reset switch device N9 is coupled between the seventh node QF and the common node CON, and operated in response to a fourth reset signal FRST. The fourth set switch device N10 is coupled between the eighth node QF_N and the common node CON, and operated in response to a fourth set signal FSET.

The data I/O circuit 308 is coupled to the first latch LAT1 of the latch circuit 306, and is configured to input data to the first latch LAT1 or output data from the first latch LAT1. The data I/O circuit 308 includes a first I/O switch N12 and a second I/O switch N13. The first I/O switch N12 is coupled between the first node QC and a first data line DL, and operated in response to an I/O signal CS. The second I/O switch N13 is coupled between the second node QC_N and a second data line DL/, and operated in response to the I/O signal CS. An inverse signal of a signal transferred to the second data line DL/ is supplied to the first data line DL. That is, when an operation of inputting data to the first latch LAT1 is performed, opposite signals are inputted to the first data line DL and the second data line DL/.

The second discharge circuit 309 comprises an NMOS transistor N11 coupled between the common node CON and the ground terminal Vss, and configured to discharge the common node CON according to a voltage level of the second sense node SO2.

Figure 4A:
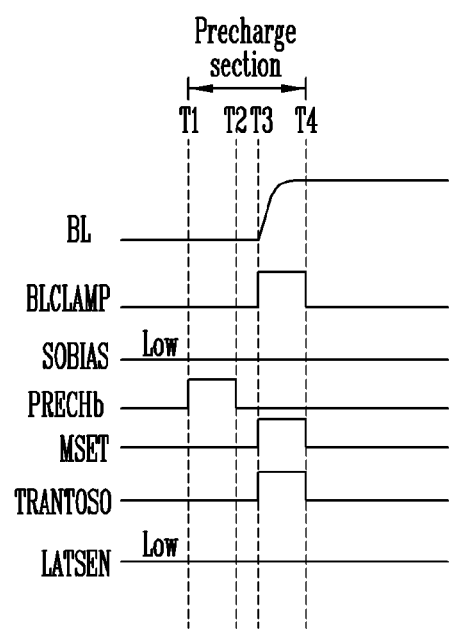
FIGS. 4A and 4B are timing diagrams illustrating a method of operating the page buffer of FIG. 3.
Figure 4B:
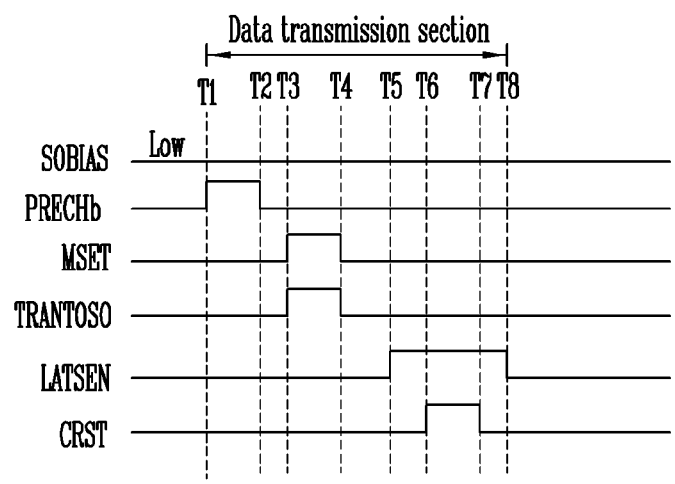

FIGS. 4A and 4B are timing diagrams illustrating a method of operating the page buffer of FIG. 3.

A method of precharging the bit line BL based on data stored in a latch is described below with reference to FIG. 4A.

A bit line transmission signal BLCLAMP, a variable voltage SOBIAS, a precharge signal PRECHb, a first to fourth reset signals CRST, MRST, TRST, and FRST, a first to fourth set signals CSET, MSET, TSET, and FSET, a transmission signal TRANTOSO, and a sense signal LATSEN remain in a low level.

At a point of time T1, the precharge signal PRECHb shifts to a high level, and thus the NMOS transistor N2 of the precharge circuit 303 is turned on. Accordingly, the second sense node SO2 is discharged, and the NMOS transistor N11 of the second discharge circuit 309 is turned off. At this time, the sense signal LATSEN remains in a low level so that the first sense node SO1 and the second sense node SO2 are electrically disconnected. At a point of time T2, the precharge signal PRECHb shifts to a low level. If data '1' has been inputted to the second latch LAT2 (that is, if voltage of a high level has been supplied to the fourth node QM_N), at a point of time T3, the second set signal MSET, the transmission signal TRANTOSO, and the bit line transmission signal BLCLAMP shift to a high level. When the second set signal MSET shifts to a high level, voltage of a high level, supplied to the fourth node QM_N, is transferred to the common node CON. Since the NMOS transistor N15 is turned on in response to the transmission signal TRANTOSO, the common node CON and the first sense node SO1 are coupled. Since the bit line transmission signal BLCLAMP is in a high level, the first sense node SO1 and the bit line BL selected by the bit line selector 301 are coupled. Accordingly, the voltage of a high level supplied to the second latch LAT2 is transferred to the selected bit line BL through the common node CON and the first sense node SO1. Consequently, the selected bit line BL can be charged. In the exemplary embodiment of this disclosure, an example in which data of a high level is supplied to the fourth node QM_N of the second latch LAT2 has been described. However, when data inputted to the second, sixth, or eighth node QC_N, QT_N, or QF_N of the first, third, or fourth latch is in a high level, the set signal CSET, TSET, or FSET of a high level may be supplied to the switch devices N4, N8, or N10 of a relevant latch so that voltage of a high level is transferred to the common node CON. At a point of time T4, the second set signal MSET, the transmission signal TRANTOSO, and the bit line transmission signal BLCLAMP shift to a low level. If data '0' has been inputted to the second latch LAT2, the bit line BL can be discharged using the above method.

A method of sending data, stored in the second latch LAT2, to the first latch LAT1 is described below with reference to FIG. 4B.

The variable voltage SOBIAS, the precharge signal PRECHb, the first to fourth reset signals CRST, MRST, TRST, and FRST, the first to fourth set signals CSET, MSET, TSET, and FSET, the transmission signal TRANTOSO, and the sense signal LATSEN remain in a low level.

At a point of time T1, the precharge signal PRECHb shifts to a high level, and thus a variable voltage SOBIAS of a low level is supplied to the second sense node SO2. When a voltage level of the second sense node SO2 becomes a low level, the NMOS transistor N11 of the second discharge circuit 309 is turned off. At a point of time T2, the precharge signal PRECHb shifts to a low level. At a point of time T3, the second set signal MSET and the transmission signal TRANTOSO shift to a high level, and thus data stored in the second latch LAT2 is transferred to the first sense node SO1. At a point of time T4, the second set signal MSET and the transmission signal TRANTOSO shift to a low level, and thus the first sense node SO1 and the common node CON are electrically disconnected. At a point of time T5, the sense signal LATSEN shifts to a high level, and thus the data of the first sense node SO1 is transferred to the second sense node SO2. In the state in which the transmission signal LATSEN remains in a high level, the first reset signal CRST shifts to a high level, and thus the first node QC and the common node CON are coupled. The NMOS transistor N11 of the second discharge circuit 309 is turned on or off based on the data stored in the second sense node SO2. When the NMOS transistor N11 of the discharge circuit 309 is turned on, the common node CON is discharged, and thus the data of the second latch LAT2 is transferred to the first latch LAT1. However, when the NMOS transistor N11 of the second discharge circuit 309 is turned off, the first latch LAT1 maintains previous data.

Although not shown, a program, read, or erase operation may be performed by applying the methods described with reference to FIGS. 4A and 4B.

Figure 5:
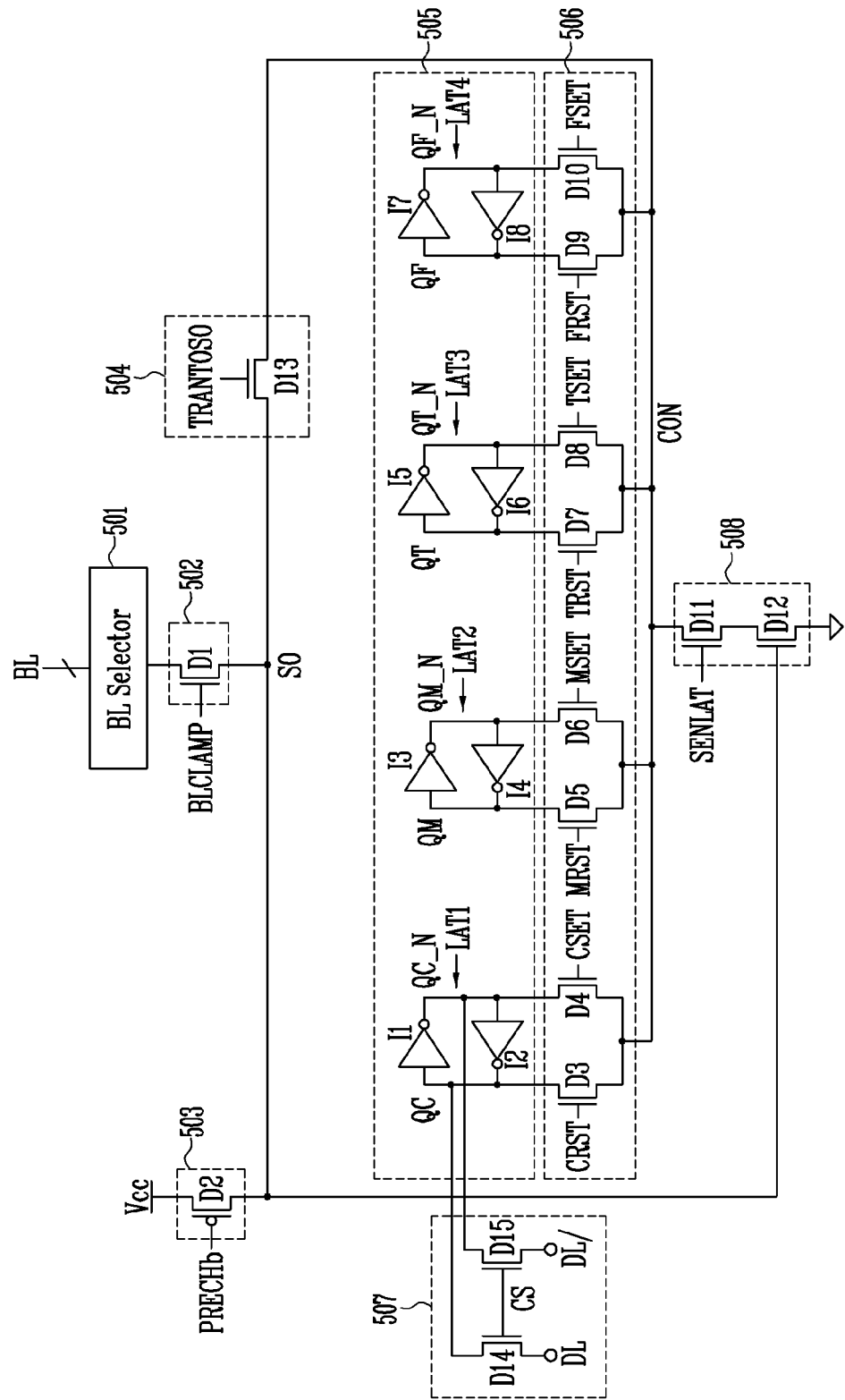
FIG. 5 is a circuit diagram showing a page buffer according to another exemplary embodiment of this disclosure.

FIG. 5 is a circuit diagram showing a page buffer according to another exemplary embodiment of this disclosure.

The page buffer PBm includes a bit line selector 501, a bit line transmission circuit 502, a precharge circuit 503, a transmission circuit 504, a latch circuit 505, a set/reset circuit 506, a data I/O circuit 507, and a discharge circuit 508.

The bit line selector 501 selects the bit lines BL coupled to the memory cell array 110.

The bit line transmission circuit 502 couples the bit line BL, selected by the bit line selector 501, to a sense node SO in response to a bit line transmission signal BLCLAMP. The bit line transmission circuit 502 comprises an NMOS transistor D1 coupled between the bit line selector 501 and the sense node SO.

The precharge circuit 503 precharges the sense node SO by coupling a power supply terminal Vcc and the sense node SO in response to a precharge signal PRECHb. To this end, the precharge circuit 503 comprises a PMOS transistor D2 coupled between the power supply terminal Vcc and the sense node SO, and operated in response to the precharge signal PRECHb.

The transmission circuit 504 comprises an NMOS transistor D13 coupled between the sense node SO and a common node CON, and operated in response to a transmission signal TRANTOSO.

In the exemplary embodiment of this disclosure, the latch circuit 505 including four latches, i.e., a first to a fourth latches LAT1 to LAT4 is described as an example. The first latch LAT1 includes a first inverter I1 and a second inverter I2. The output terminal of the first inverter I1 and the input terminal of the second inverter I2 are coupled, and the output terminal of the second inverter I2 and the input terminal of the first inverter I1 are coupled. A node coupled to the input terminal of the first inverter I1 is called a first node QC, and a node coupled to the output terminal of the first inverter I1 is called a second node QC_N. In particular, the first latch LAT1 is coupled to the data I/O circuit 507 and is configured to store data received from the data I/O circuit 507 or transfer inputted data to the data I/O circuit 507. Furthermore, the first latch LAT1 transfers data, received from the data I/O circuit 507, to other latches. The data I/O circuit 507 is described later.

The second latch LAT2 includes a third inverter I3 and a fourth inverter I4. The output terminal of the third inverter I3 and the input terminal of the fourth inverter I4 are coupled, and the output terminal of the fourth inverter I4 and the input terminal of the third inverter I3 are coupled. A node coupled to the input terminal of the third inverter I3 is called a third node QM, and a node coupled to the output terminal of the third inverter I3 is called a fourth node QM_N. The third latch LAT3 includes a fifth inverter I5 and a sixth inverter I6. The output terminal of the fifth inverter I5 and the input terminal of the sixth inverter I6 are coupled, and the output terminal of the sixth inverter I6 and the input terminal of the fifth inverter I5 are coupled. A node coupled to the input terminal of the fifth inverter I5 is called a fifth node QT, and a node coupled to the output terminal of the fifth inverter I5 is called a sixth node QT_N. The fourth latch LAT4 includes a seventh inverter I7 and an eighth inverter I8. The output terminal of the seventh inverter I7 and the input terminal of the eighth inverter I8 are coupled, and the output terminal of the eighth inverter I8 and the input terminal of the seventh inverter I7 are coupled. A node coupled to the input terminal of the seventh inverter I7 is called a seventh node QF, and a node coupled to the output terminal of the seventh inverter I7 is called an eighth node QF_N.

The set/reset circuit 506 sets or resets the first to fourth latches LAT1 to LAT4 of the latch circuit 505 or to transfer data. The set/reset circuit 506 includes a plurality of switch devices D3 to D10 coupled between the first to eighth nodes QC to QF_N and the common source CON. Each of the switch devices D3 to D10 comprises an NMOS transistor. Each of the switch devices D3 to D10 is described in detail below.

The first reset switch device D3 is coupled between the first node QC and the common node CON, and operated in response to a first reset signal CRST. The first set switch device D4 is coupled between the second node QC_N and the common node CON, and operated in response to a first set signal CSET. The second reset switch device D5 is coupled between the third node QM and the common node CON, and operated in response to a second reset signal MRST. The second set switch device D6 is coupled between the fourth node QM_N and the common node CON, and operated in response to a second set signal MSET. The third reset switch device D7 is coupled between the fifth node QT and the common node CON, and operated in response to a third reset signal TRST. The third set switch device D8 is coupled between the sixth node QT_N and the common node CON, and operated in response to a third set signal TSET. The fourth reset switch device D9 is coupled between the seventh node QF and the common node CON, and operated in response to a fourth reset signal FRST. The fourth set switch device D10 is coupled between the eighth node QF_N and the common node CON, and operated in response to a fourth set signal FSET.

The data I/O circuit 507 is coupled to the first latch LAT1 of the latch circuit 505, and is configured to input data to the first latch LAT1 or output data from the first latch LAT1. The data I/O circuit 507 includes a first I/O switch D14 and a second I/O switch D15. The first I/O switch D14 is coupled between the first node QC and a first data line DL, and operated in response to an I/O signal CS. The second I/O switch D15 is coupled between the second node QC_N and a second data line DL/, and operated in response to the I/O signal CS. An inverse signal of a signal transferred to the second data line DL/ is supplied to the first data line DL. That is, when an operation of inputting data to the first latch LAT1 is performed, opposite signals are inputted to the first data line DL and the second data line DL/.

The discharge circuit 508 includes a sense switch D11 and a discharge switch D12 coupled in series between the common node CON and the ground terminal Vss. The sense switch D11 comprises an NMOS transistor operated in response to a sense signal SENLAT. The discharge switch D12 comprises an NMOS transistor operated in response to a voltage level of the sense node SO.

FIGS. 6A and 6B are timing diagrams illustrating a method of operating the page buffer of FIG. 5.

A method of precharging the bit line BL based on data stored in a latch is described below with reference to FIG. 6A.

A bit line transmission signal BLCLAMP, a first to fourth reset signals CRST, MRST, TRST, and FRST, a first to fourth set signals CSET, MSET, TSET, and FSET, a transmission signal TRANTOSO, and a sense signal SENLAT remain in a low level, and a precharge signal PRECHb remains in a high level.

At a point of time T1, the second set signal MSET, the transmission signal TRANTOSO, and the bit line transmission signal BLCLAMP shift to a high level. Accordingly, the fourth node QM_N of the second latch LAT2, the common node CON, the sense node SO, and the bit line BL are coupled. Accordingly, if voltage of a high level has been supplied to the fourth node QM_N, the bit line BL selected by the bit line selector 501 is charged. If voltage of a low level has been supplied to the fourth node QM_N, the bit line BL is discharged. At a point of time T2, the second set signal MSET, the transmission signal TRANTOSO, and the bit line transmission signal BLCLAMP shift to a low level.

A method of sending data, stored in the second latch LAT2, to the first latch LAT1 is described below with reference to FIG. 6B.

The precharge signal PRECHb remains in a high level, and the first to fourth reset signals CRST, MRST, TRST, and FRST, the first to fourth set signals CSET, MSET, TSET, and FSET, the transmission signal TRANTOSO, and the sense signal SENLAT remain in a low level.

At a point of time T1, in order to transfer, data inputted to the second latch LAT2, to the sense node SO, the second set signal MSET and the transmission signal TRANTOSO shift to a high level. At a point of time T2, the second set signal MSET and the transmission signal TRANTOSO shift to a low level. At a point of time T3, when the sense signal SENLAT shifts to a high level, the common node CON is discharged or remains in a previous state based on data stored in the sense node SO. At a point of time T4, when the first reset signal CRST shifts to a high level, data is inputted to the first latch LAT1 in response to a voltage level of the common node CON. At a point of time T5, the first reset signal CRST shifts to a low level. At a point of time T6, the sense signal SENLAT shifts to a low level.

Program, read, and erase operations may be performed by combining the methods of operating the page buffers PB1 to PBm.

According to this disclosure, the number of transistors of the page buffer can be reduced. Accordingly, the number of signals for an operation can be reduced, and thus an operating method can be simplified. Furthermore, since the number of transistors is reduced, the size of the page buffer and thus the size of a nonvolatile memory device can be reduced.

What is claimed is:

1. A nonvolatile memory device, comprising:
   a plurality of latches for storing data;
   a set/reset circuit for transferring data, stored in a selected latch of the latches, to a common node;
   a transmission circuit for transferring the data of the common node to a first sense node;
   a bit line transmission circuit for transferring the data of the first sense node to a bit line;
   a sense circuit for transferring the data of the first sense node to a second sense node; and
   a discharge circuit for changing a voltage level of the common node based on the data of the second sense node.

2. The nonvolatile memory device of claim 1, wherein the sense circuit comprises an NMOS transistor for coupling the first sense node and the second sense node in response to a sense signal.

3. The nonvolatile memory device of claim 1, wherein the precharge circuit comprises an NMOS transistor for discharging the second sense node by coupling the second sense node and a terminal of a variable voltage node, in response to a precharge signal.

4. The nonvolatile memory device of claim 3, wherein the variable voltage of the variable voltage node is a power supply voltage or a ground voltage.

5. The nonvolatile memory device of claim 1, wherein the discharge circuit comprises an NMOS transistor for discharging the common node based on a voltage level of the second sense node.

6. The nonvolatile memory device of claim 1, wherein the transmission circuit comprises an NMOS transistor for transferring the voltage of the common node to the first sense node in response to a transmission signal.

7. The nonvolatile memory device of claim 1, further comprising a data I/O circuit coupled to any one of the latches and configured to input or output data.

8. The nonvolatile memory device of claim 1, wherein the set/reset circuit comprises a reset switch and a set switch which are coupled to each of the latches.

9. A method of operating a nonvolatile memory device, the method comprising:
   providing a page buffer, comprising a sense circuit coupled between a first sense node and a second sense node, a transmission circuit coupled between the first sense node and a common node, a discharge switch configured to discharge the common node based on a voltage level of the second sense node, and a plurality of latches configured to transmit inputted data to the common node;
   inputting data to any one of the latches;
   transferring the data, inputted to the latch, to the common node;
   transferring the data of the common node to the first sense node by deactivating the sense circuit and the discharge switch, and activating the transmission circuit; and
   charging or discharging a selected bit line based on the data of the first sense node.

10. The method of claim 9, wherein inputting the data to any one of the latches comprises:
    inputting the data to a latch coupled to a data I/O circuit; and
    transferring the data of the latch, coupled to the data I/O circuit, to another latch.

11. The method of claim 10, wherein transferring the data of the latch, coupled to the data I/O circuit, to another latch comprises:
    deactivating the discharge switch and transferring the data of the latch, coupled to the data I/O circuit, to the common node;
    transferring the data of the common node to the first sense node by activating the transmission circuit;
    transferring the data of the first sense node to the second sense node by deactivating the transmission circuit and activating the sense circuit;
    discharging the common node or maintaining the common node in a previous state by operating the discharge switch based on the data of the second sense node; and
    coupling the common node and a latch to which data will be inputted.

* * * * *